United States Patent
Lee et al.

(10) Patent No.: US 7,322,843 B1
(45) Date of Patent: Jan. 29, 2008

(54) CAM ACTIVATED CIRCUIT CARD CLAMP

(75) Inventors: Ying-Ming Lee, Melbourne, FL (US);
Matthew Neil, Melbourne, FL (US);
Frank Daneshgar, Satellite Beach, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/484,517

(22) Filed: Jul. 11, 2006

(51) Int. Cl.
*H01R 13/62* (2006.01)
(52) U.S. Cl. ..................................... 439/327
(58) Field of Classification Search ............... 439/327, 439/326, 325; 361/728, 707, 715; 411/75, 411/24; 403/409.1
See application file for complete search history.

(56) References Cited

U.S. PATENT DOCUMENTS

| | | | |
|---|---|---|---|
| 4,775,260 A | 10/1988 | Kecmer | |
| 4,819,713 A | 4/1989 | Weisman | |
| 5,071,013 A | 12/1991 | Peterson | |
| 5,224,016 A | 6/1993 | Weisman et al. | |
| 5,317,482 A | 5/1994 | Bujtas | |
| 6,007,358 A | * 12/1999 | Nagase | 439/327 |

* cited by examiner

*Primary Examiner*—Alexander Gilman
(74) *Attorney, Agent, or Firm*—Darby & Darby; Robert J. Sacco

(57) ABSTRACT

A cam activated circuit card clamp is provided. The circuit card clamp is comprised of a base member (204), a leverage arm (412), and a cam activation shaft (422). The circuit card clamp is also comprised of one or more cams (410-1, 410-2, 410-3, 410-4), one or more ramp members (308-1, 308-2, 308-3, 308-4), and one or more wedge members (418-1, 418-2, 418-3, 418-4). The cam activation shaft is coupled to the leverage arm. The cams are in contact with the cam activation shaft which has one or more compression springs disposed thereon. The cams are adapted to pivot about a pivot shaft when actuated. The cams also have a surface adapted to engage an adjacent wedge member when actuated. Each ramp member has an inclined surface adapted to deflect an adjacent wedge member when the adjacent wedge member is compressed against the ramp member. Each wedge member has a surface adapted to engage an adjacent cam. Each wedge member also has an inclined surface adapted to slidingly engage an adjacent ramp member when compressed together. A method for applying a clamping force to a circuit card is also provided.

25 Claims, 13 Drawing Sheets

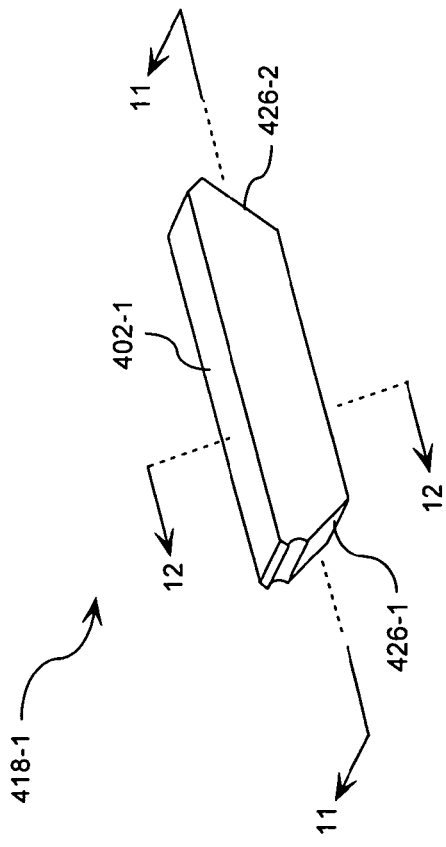
FIG. 10
FIG. 12
FIG. 11

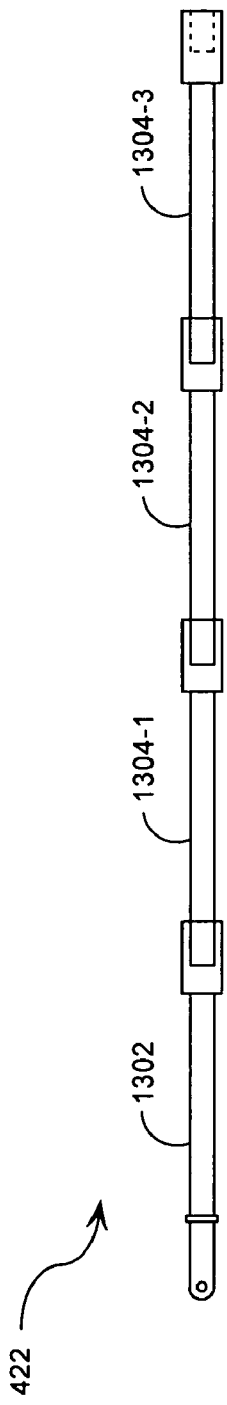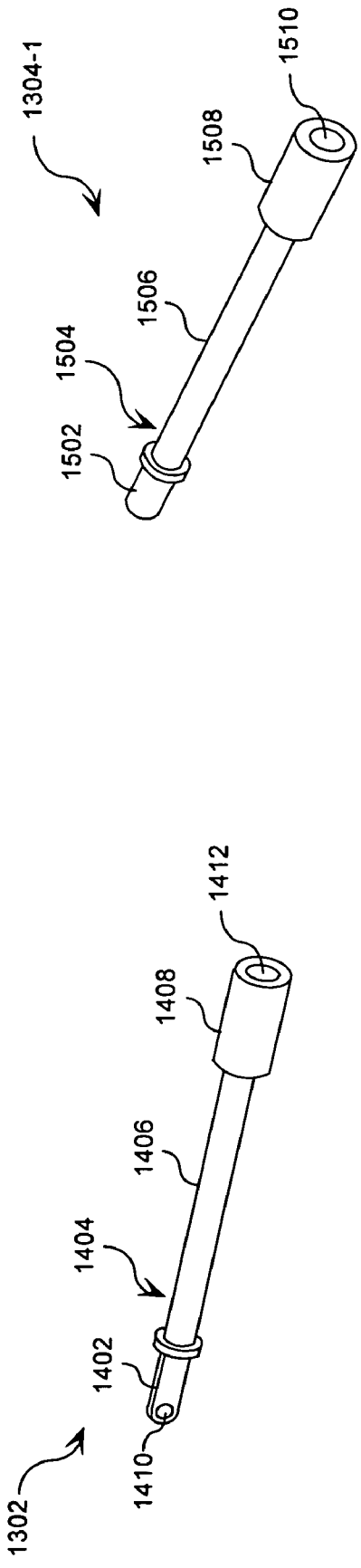
FIG. 13
FIG. 14
FIG. 15

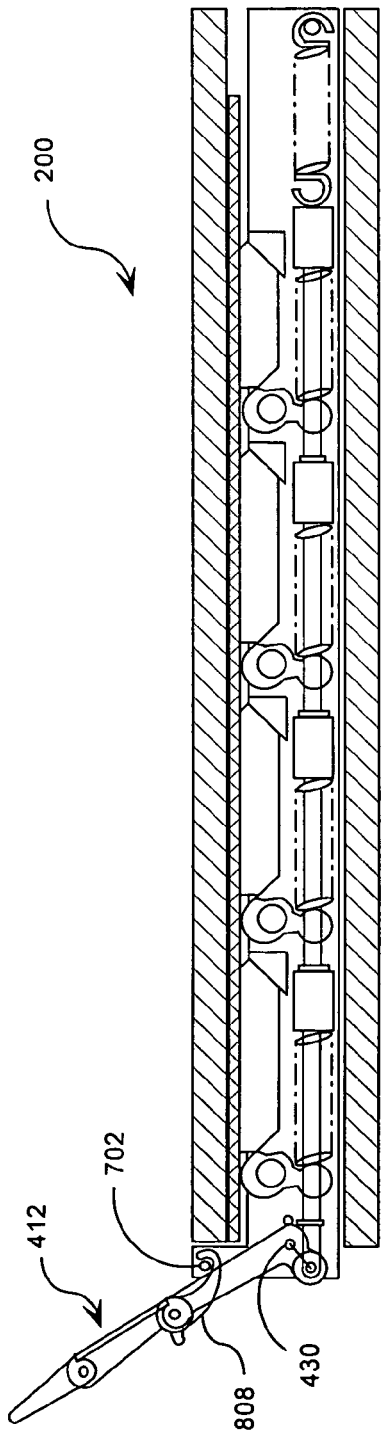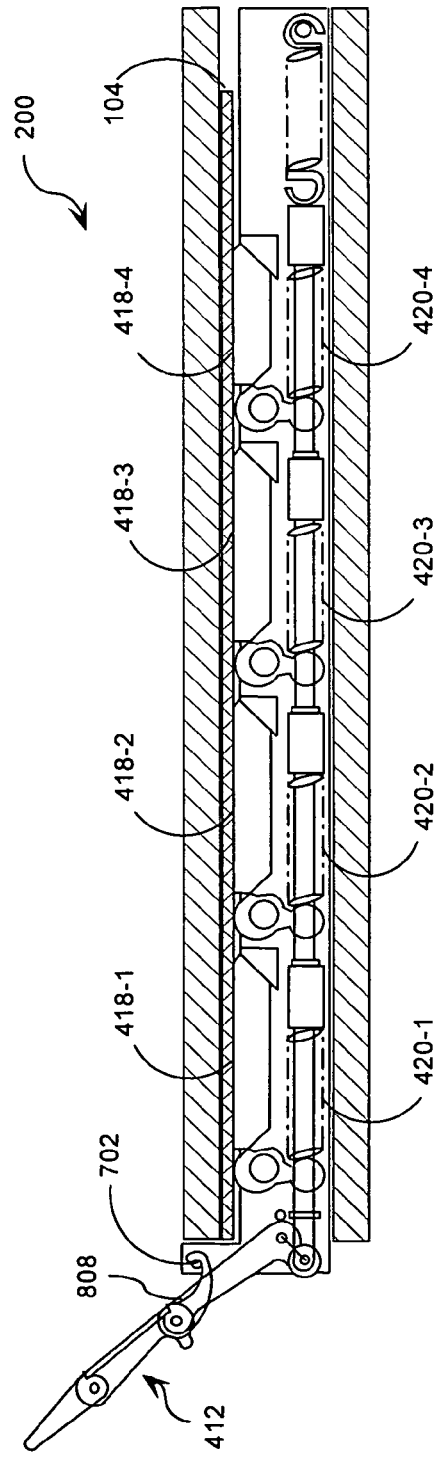

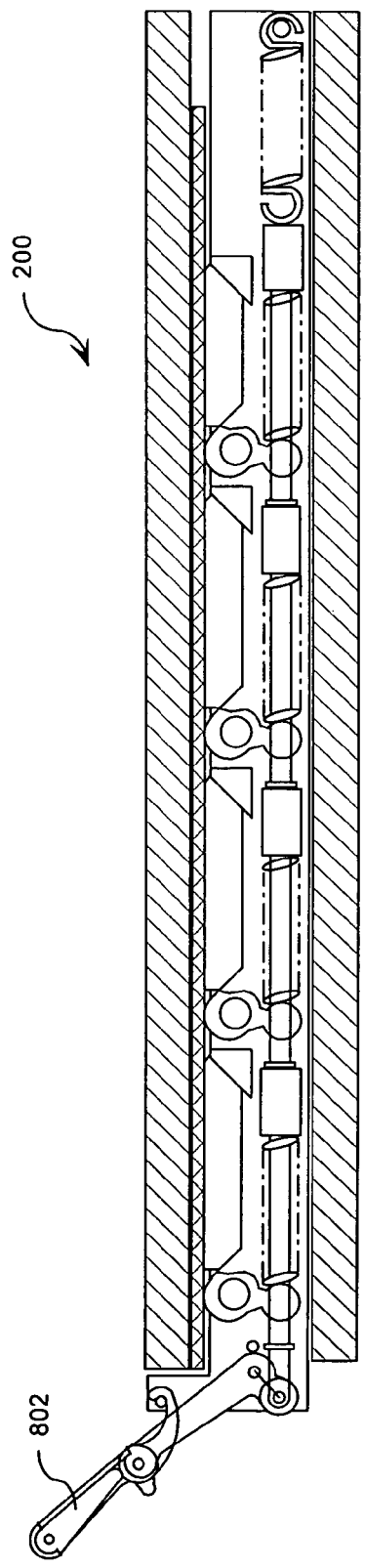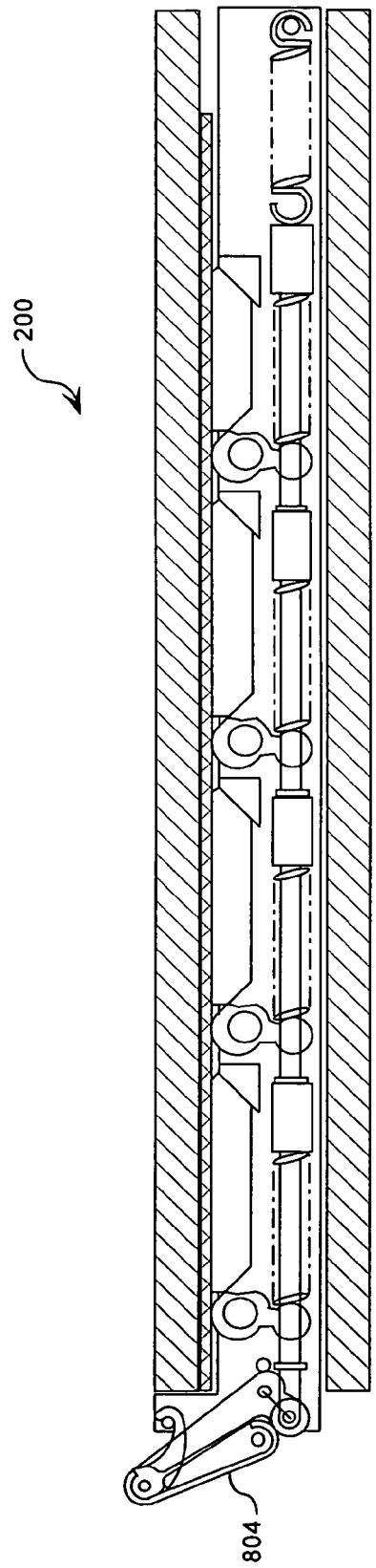
FIG. 16G
FIG. 16H

CAM ACTIVATED CIRCUIT CARD CLAMP

BACKGROUND OF THE INVENTION

1. Statement of the Technical Field

The invention concerns clamping mechanisms, and more particularly, clamping mechanisms for fastening printed circuit boards or printed circuit cards to chassis.

2. Description of the Related Art

Traditionally, circuit card clamps have been used for fastening circuit cards within a slot of a chassis such as a heat exchanger, heat sink, or cold plate. For example, U.S. Pat. No. 4,775,260 to Kecmer and U.S. Pat. No. 5,071,013 to Peterson describe circuit card clamps consisting of a threaded rod with wedge-shaped bodies disposed thereon. A circuit card clamp coupled to a circuit card can be inserted into a chassis slot. Subsequently, the threaded rod can be rotated with a tool (i.e., torque wrench) in order to shorten the length of the circuit card clamp. By shortening the circuit card clamp, the wedge-shaped bodies are compressed thereby creating an increase in the circuit card clamp's width. As a result, a clamping force is exerted by the circuit card clamp securing the circuit card to the chassis.

The above described circuit card clamps suffer from certain drawbacks. For example, the threaded rod needs to be turned to create a desired clamping force by the circuit card clamp. The threaded rod also needs to be turned to create a clamping force which ensures contact between a circuit card and a heat sink, thereby providing efficient thermal conductivity. Often, specific clamping forces are required to prevent loosening of circuit card from chassis due to external forces (e.g., vibration forces). Of necessity, torque wrench measurements have been required to prevent over tightening of the threaded rod which can damage the circuit card and may strip the threaded rod. This process requires using external tools. Ultimately, the clamping device and the thermal performance of the circuit card clamp's architecture are limited by the size of the threaded rod. For example, the size of the threaded rod dictates the quantity of wedge-shaped bodies included in a circuit card clamp assembly.

U.S. Pat. No. 5,224,016 to Weisman et al. describes a circuit card clamp having a rail with wedge-shaped bodies disposed thereon. Such a circuit card clamp assembly is similar to the wedge architectures described above. However, this circuit card clamp assembly provides a tool-free insertion and extraction of the circuit card from the chassis.

This circuit card clamp assembly similarly suffers from drawbacks. For example, the clamping device is limited by the quantities and the strength of the beveled washers which create the clamping force. This limitation typically results in an insufficient clamping force exerted by the circuit card clamp for adequately fastening a circuit card to a chassis to prevent loosening of a circuit card.

Despite the various circuit card clamp assemblies known in the art there remains a need for a wedge assembly that is able to provide improved thermal performance by optimizing a thermal interface between a circuit card and a chassis. Also needed is a tool-free circuit card clamp assembly which provides improved clamping force for adequately fastening a circuit card to a chassis.

SUMMARY OF THE INVENTION

The invention concerns a method for applying a clamping force to a circuit card for purposes of securing the circuit card to a chassis. The method includes rotatably mounting one or more cams to a base member. The cams are linearly spaced apart along the base member in a direction parallel to a first direction. A first end of each cam rotates about a pivot point by applying a force to a second end of the cams. The force is aligned with the first direction and is applied to the second end of the cam using an elongated cam activation shaft having one or more compression springs disposed thereon. The compression springs are positioned along the cam activation shaft such that a compression spring resides between each cam. A force is applied to the cam activation shaft using a leverage arm pivotally coupled to the base member. The force is coupled from the leverage arm to the cam activation shaft at a rotatable pivot coupling formed on a first end of the cam activation shaft. Finally, the method includes moving a wedge member in a second direction transverse to the first direction. This occurs when a camming surface formed on the first end of a cam is slid along a first side of the wedge member. The method further includes guiding a second side of the wedge member along a ramp member defining an inclined surface.

According to an aspect of the invention, the method includes resiliently biasing the cam activation shaft in a second direction opposed to the first direction. This step can include attaching a tension spring between a portion of the cam activation shaft and the base member. The tension spring can provide a system to cause the cam activation shaft to retract, cams to pivot counter-clockwise about the respective pivot points, and wedge members to be released from a locked position when the leverage arm is released from a latched position.

According to another aspect of the invention, the method further includes positioning the base member so that a clamping surface of the wedge member is opposed from a rigid clamping face extending in a direction transverse to the second direction. The rigid clamping face can be an edge of a chassis. Accordingly, an insert space sized for receiving the circuit card is defined.

A circuit card clamp is also provided. The circuit card clamp is comprised of a base member, one or more cams, a cam activating device, and a wedge member. The cams are rotatably mounted to a shaft connected to the base member. Each cam has a first camming surface disposed on their first ends. The cam activating device is comprised of an elongated shaft having one or more compression springs disposed thereon. The compression springs are positioned along the cam activation shaft such that a compression spring resides between each cam. The shaft is coupled to a second end of each cam. The cam activating device is also configured to produce a rotational motion of each cam. The wedge member has one or more sides positioned for engaging the first camming surface and is movable from a first position to a second position in response to a rotational motion of a cam.

The first and second ends of each cam are spaced apart by a body portion disposed between the first and second ends. The second end of each cam is radially spaced apart from the first end such that a motion of the second end defines a curved path about the shaft when each cam is rotated. A cam engagement face is provided along a length of the elongated shaft. The cam engagement face is configured for engaging a second camming surface formed on the second end of each cam. The elongated shaft is slidably mounted to the base member such that a linear movement aligned with a tangent to a portion of the curved path can be provided.

A leverage arm is provided that is rotatably coupled to a first end of the elongated shaft and pivotally coupled to the base member. By varying a position of the leverage arm, linear movement is produced. A ramp is also provided that is mounted in a fixed position relative to the base member.

A tension spring is provided that resiliently biases the elongated shaft. The tension spring is attached between a portion of the cam activation shaft and the base member. The tension spring can provide a system to cause the cam activation shaft to retract, cams to pivot counter-clockwise about the respective pivot points, and wedge members to be released from a locked position when the leverage arm is released from a latched position.

According to an aspect of the invention, the wedge member has a ramp engagement surface defined on its second side opposed from its first side. The ramp engagement surface is positioned adjacent to an inclined surface defined by the ramp member. When actuated, the ramp engagement surface slides along the inclined surface to move the wedge member from a first position to a second position in response to a rotational motion of an adjacent cam.

According to another aspect of the invention, the circuit card clamp is comprised of one or more cams rotatably mounted to one or more shafts linearly spaced apart along a length of the base member. The cam activating device is coupled to each cam and configured to produce a rotational motion of each cam. One or more wedge members are provided with at least one side positioned for engaging the first camming surface of each cam. The wedge members are movable from a first position to a second position in response to the rotational motion of each cam.

According to another aspect of the invention, the circuit card clamp is positioned within a slot of a chassis so that a clamping surface of each wedge member is opposed from a rigid clamping face. The clamping surface of each wedge member is spaced apart from the clamping face to define an insert space sized for receiving the circuit card.

BRIEF DESCRIPTION OF THE DRAWINGS

Embodiments will be described with reference to the following drawing figures, in which like numerals represent like items throughout the figures, and in which:

FIG. 10 is a perspective view of a wedge member that is useful for understanding the invention.

FIG. 11 is a cross-sectional view of a wedge member taken along line 11-11 of FIG. 10.

FIG. 12 is a cross-sectional view of a wedge member taken along line 12-12 of FIG. 10.

FIG. 13 is a top view of a cam activation shaft that is useful for understanding the invention.

FIG. 14 is a perspective view of a cam activation shaft's primary shaft member that is useful for understanding the invention.

FIG. 15 is a perspective view of a cam activation shaft's secondary shaft member that is useful for understanding the invention.

FIGS. 16A-FIG. 16H collectively illustrate a circuit card clamp engagement that is useful for understanding the invention.

DETAILED DESCRIPTION OF THE PREFERRED EMBODIMENTS

Figure 1:
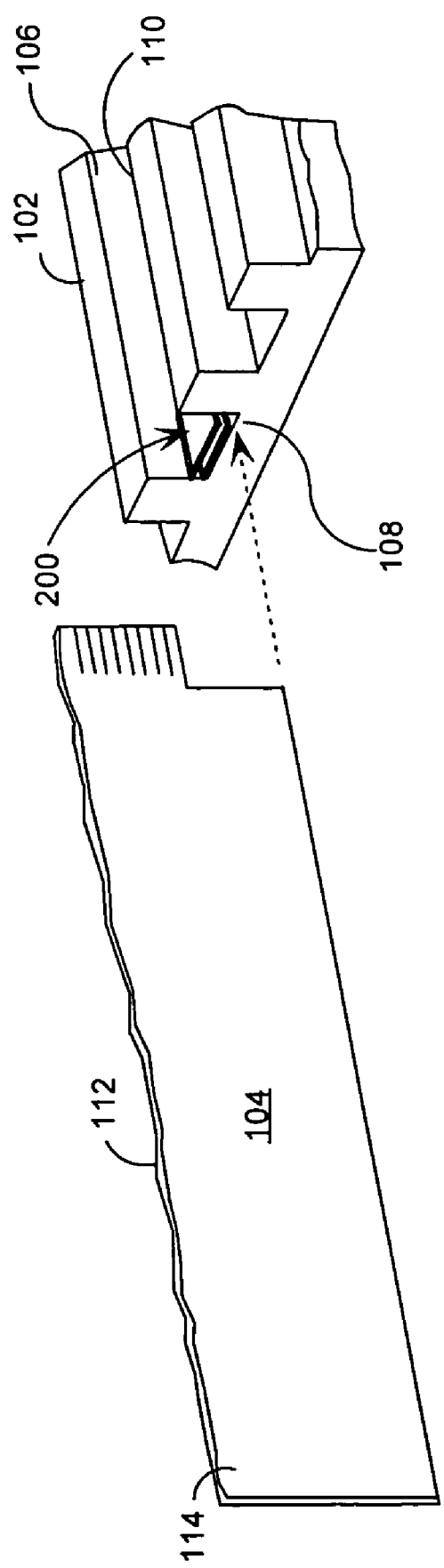
FIG. 1 is an elevated perspective view of a circuit card and a chassis comprising a circuit card clamp assembly that is useful for understanding the invention.

FIG. 1 is an elevated perspective view of a circuit card 104 and a chassis 102 comprising a circuit card clamp 200 that is useful for understanding the invention. Chassis 102 is often comprised of a heat exchanger (i.e., a cold plate or a heat sink) to dissipate heat generated by an electrical circuit implemented on the circuit card 104. However, chassis 102 can also be comprised of any device commonly used in the art for mounting one or more circuit cards in a vertical arrangement, such as a mounting rack. Circuit card clamp 200 is shown attached to chassis 102 in slot 106. However, the invention is not limited in this regard. Circuit card clamp 200 can also be adapted for attachment to circuit card 104. Slot 106 often has a width larger then the thickness of circuit card 104 plus the width of circuit card clamp 200. Slot 106 with circuit card clamp 200 implemented therein can provide an insert space 108 to receive an edge of circuit card 104. Insert space 108 is often comprised of a length that exceeds the length of circuit card 104. As shown in FIG. 1, circuit card 104 can be inserted into slot 106 through the provided insert space 108. Once the circuit card 104 is fully positioned in insert space 108, circuit card clamp 200 can be actuated such that a surface 112 of circuit card 104 is engaged by circuit card clamp 200. When circuit card clamp 200 is fully engaged, surface 114 of circuit card 104 abuts edge 110 of chassis. Accordingly, circuit card 104 is secured against an edge 110 of chassis 102. Circuit card clamp 200 will be described in great detail below (in relation to FIG. 2 through FIG. 16H).

Figure 2:
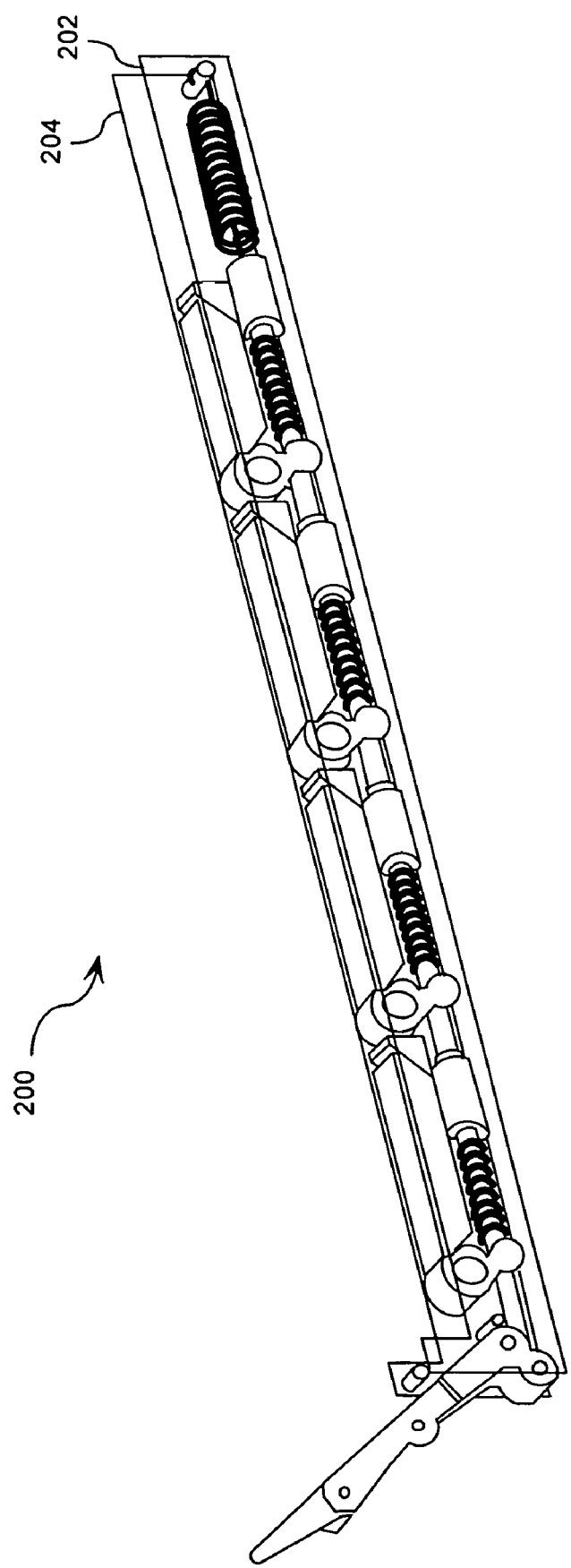
FIG. 2 is an elevated perspective view of a circuit card clamp that is useful for understanding the invention.

Referring now to FIG. 2, there is provided a perspective view of the circuit card clamp 200 that is useful for understanding the invention. Circuit card clamp 200 is comprised of a front panel 202 and a back panel 204. Circuit card clamp 200 provides a clamping system having an optimized thermal interface between circuit card 104 and chassis 102. Circuit card clamp 200 also provides a tool-free clamping system for adequately fastening circuit card 104 to chassis 102 to prevent loosening of the circuit card 104 due to external forces, such as vibration forces.

Figure 3:
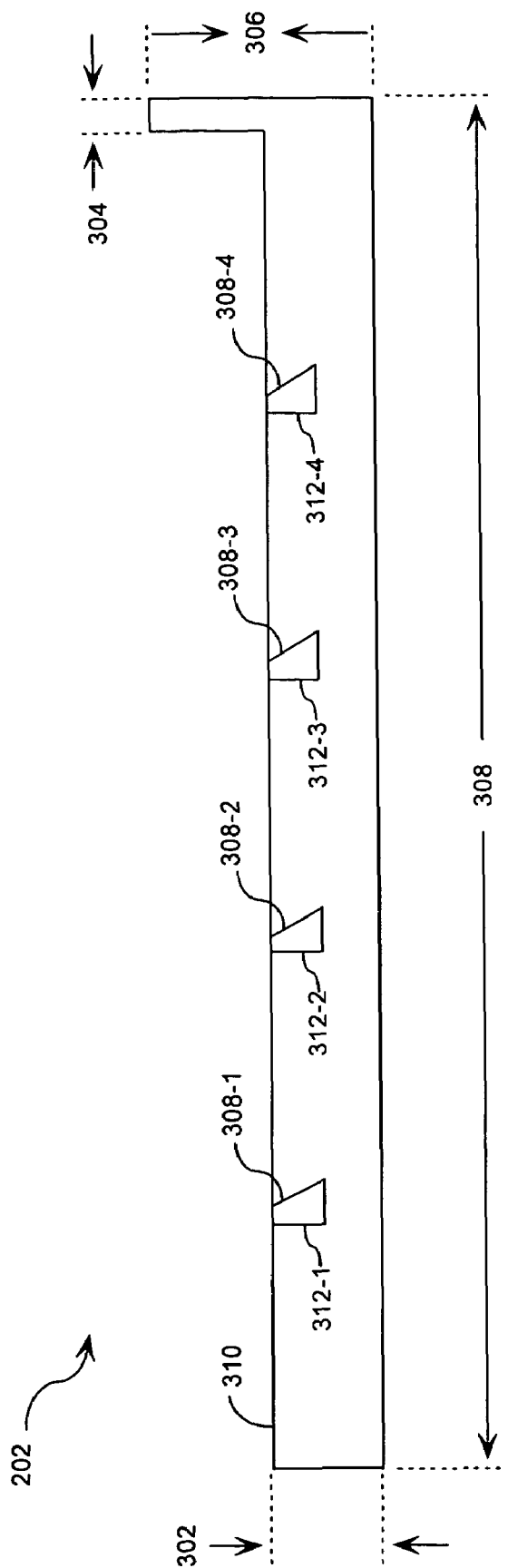
FIG. 3 is a top view of a circuit card clamp's front panel that is useful for understanding the invention.

A more detailed discussion of circuit card clamp 200 will now follow. Referring to FIG. 3, there is provided a top view of front panel 202 shown in FIG. 2. Front panel 202 is comprised of a base member 310 and ramp members 308-1, 308-2, 308-3, 308-4. Base member 310 has a first width 302, a second width 306, a first length 304, and a second length 308. Base member 310 can be comprised of any material commonly used in the art, such as a metal, a metal alloy, a composite material, or a rigid polymer.

According to an embodiment of the invention, width 306 is equal to 0.80 inches. Width 302 is equal to 0.5 inches. Length 308 is equal to 6.95 inches. Length 304 is equal to 0.15 inches. Still, a person skilled in the art will appreciate that the invention is not limited in this regard. Width 302, 306, and length 304, 308 can be selected in accordance with a circuit card clamp 200 application. For example, the thickness of circuit card 104 and the width of chassis slot 106 can dictate the sizing of base member 310.

Ramp members 312-1, 312-2, 312-3, 312-4 can be coupled to base member 310 by any means commonly used in the art, such as a rivet or an adhesive. Alternatively, front panel 202 can be machined to include ramp members 308-1, 308-2, 308-3, 308-4. Ramp members 308-1, 308-2, 308-3, 308-4 can be designed in accordance with a particular circuit card clamp 200 application. For example, each ramp member 312-1, 312-2, 312-3, 312-4 can be comprised of an inclined surface 308-1, 308-2, 308-3, 308-4. Each inclined surface 308-1, 308-2, 308-3, 308-4 can be configured so that a wedge shaped body can easily slide on top when compressed against an adjacent ramp member 308-1, 308-2, 308-3, 308-4 with a sufficient amount of pressure. Ramp members 308-1, 308-2, 308-3, 308-4 can also be comprised of any material commonly used in the art, such as a metal, a metal alloy, a composite material, or a rigid polymer.

As shown in FIG. 3, front panel 202 is comprised of four ramp members 312-1, 312-2, 312-3, 312-4. Still it should be understood that the invention is not limited in this regard. The number of ramp members and sizing of each ramp members may be varied in accordance with the type or size of circuit card clamp 200 desired.

A person skilled in the art will appreciate that the front panel 202 architecture is one embodiment of a front panel architecture. The invention is not limited in this regard and any other front panel architecture can be used without limitation.

Figure 4:
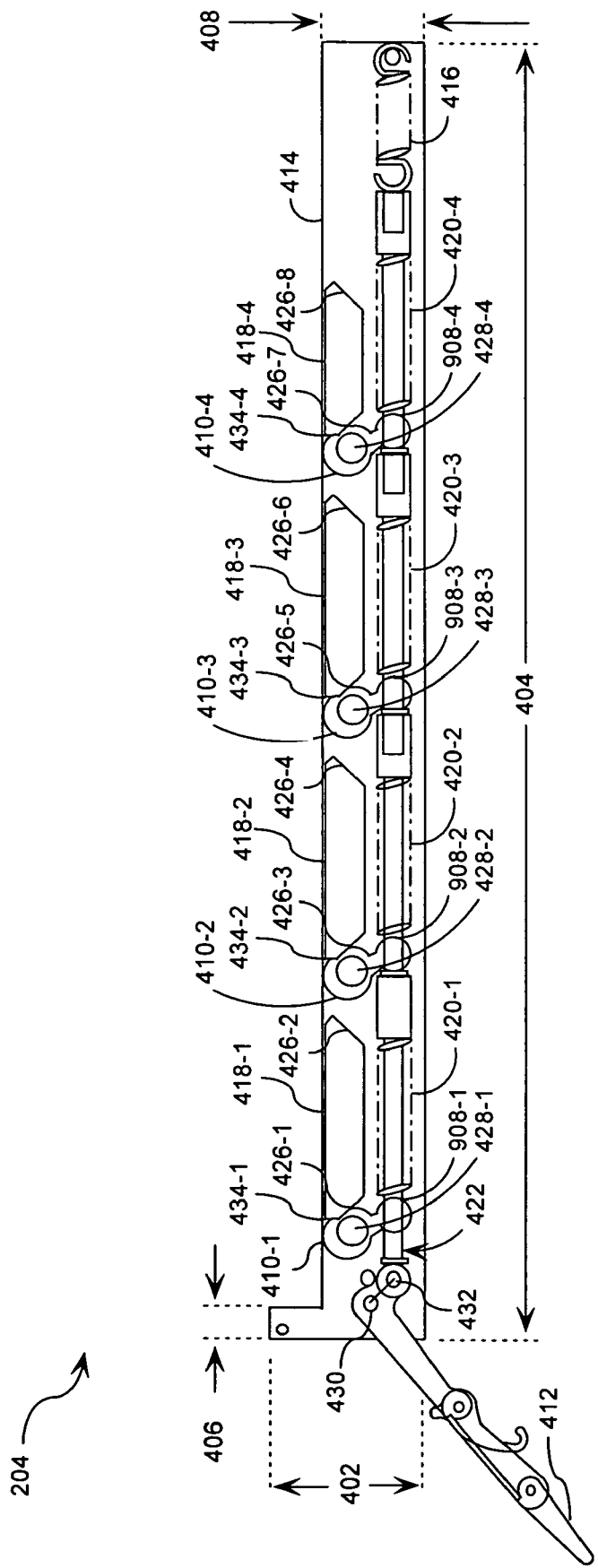
FIG. 4 is a top view of a circuit card clamp's back panel that is useful for understanding the invention.
Figure 5:
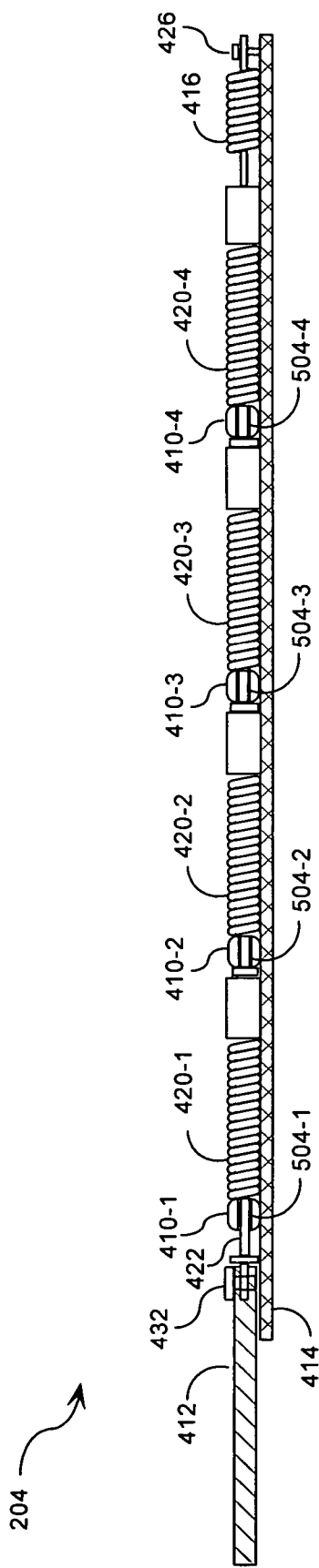
FIG. 5 is a side view of a circuit card clamp's back panel that is useful for understanding the invention.
Figure 6:
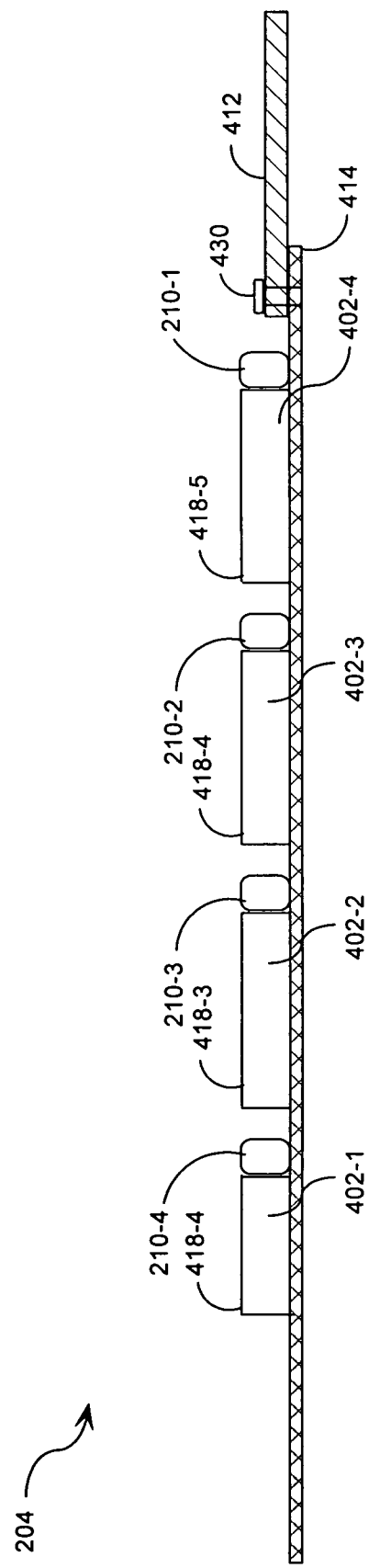
FIG. 6 is a side view of a circuit card clamp's back panel that is useful for understanding the invention.

Referring now to FIG. 4, there is provided a top view of back panel 204 shown in FIG. 2. FIG. 5 and FIG. 6 are side views of back panel 204. Back panel 204 is comprised of a base member 414, a double fold leverage arm 412, cams 410-1, 410-2, 410-3, 410-4, pivot shafts 428-1, 428-2, 428-3, 428-4, wedge members 418-1, 418-2, 418-3, 418-4, a cam activation shaft 422, a tension spring 416, and compression springs 420-1, 420-2, 420-3, 420-4. Base member 414 can be comprised of any material commonly used in the art, such as a metal, a metal alloy, a composite material, or a rigid polymer. Base member 414 has a first width 402, a second width 408, a first length 404, and a second length 406. Base member 414 will be described in great detail below (in relation to FIG. 7).

Double fold leverage arm 412 is pivotally mounted to base member 414 by mechanical connector 430 (for example, a rivet). Double fold leverage arm 412 is coupled to cam activation shaft 422 by mechanical connector 432 (for example, a rivet). Double fold leverage arm 412 provides an adequate leverage for actuating cam activation shaft 422 (i.e., applies a pulling force to cam activation shaft 422 such that it is set into motion). Double fold leverage arm 412 will be described in detail below (in relation to FIG. 8).

Cams 410-1, 410-2, 410-3, 410-4 are linearly spaced apart along base member 204. Cams 410-1, 410-2, 410-3, 410-4 can swing about a pivot point defined by respective pivot shafts 428-1, 428-2, 428-3, 428-4. The pivot shafts are coupled to base member 414. Cams 410-1, 410-2, 410-3, 410-4 and pivot shafts 428-1, 428-2, 428-3, 428-4 can be comprised of any material commonly used in the art, such as a metal, a metal alloy, a composite material, or a rigid polymer. Cams 410-1, 410-2, 410-3, 410-4 are also in contact with cam activation shaft 422 such that each cam can interact with cam activation shaft 422 when a pulling force is applied to shaft 422. Cams 410-1, 410-2, 410-3, 410-4 will be described in detail below (in relation to FIG. 9).

Wedge members 418-1, 418-2, 418-3, 418-4 are provided with opposing ends having inclined surfaces 426-1, 426-2, 426-3, 426-4, 426-5, 426-6, 426-7, 426-8. Inclined surfaces 426-2, 426-4, 426-6, 426-8 provide ramp engagement surfaces. For example, each inclined surface 426-2, 426-4, 426-6, 426-8 is configured so that they can easily slide on top of a ramp member 308-1, 308-2, 308-3, 308-4 when compressed together with a sufficient amount of pressure. Wedge members 418-1, 418-2, 418-3, 418-4 are coupled to base member 414. The manner in which each wedge member 418-1, 418-2, 418-3, 418-4 is coupled to base member 414 will be described in more detail below (in relation to FIG. 7, FIG. 11, and FIG. 12).

As shown in FIG. 4, back panel 204 is comprised of four wedge members 418-1, 418-2, 418-3, 418-4. Still it should be understood that the invention is not limited in this regard. The number of wedge members and the lengths of each wedge member may be varied in accordance with the type or size of circuit card clamp 200 desired. Wedge members 418-1, 418-2, 418-3, 418-4 will be described in more detail below (in relation to FIG. 10 through FIG. 12).

Cam activation shaft 422 is coupled to double fold leverage arm 412 by a connector 432, such as a rivet. Cam activation shaft 422 passes through passageways 504-1, 504-2, 504-3, 504-4 of cams 410-1, 410-2, 410-3, 410-4. In effect, cam activation shaft 422 can interact with each cam 410-1, 410-2, 410-3, 410-4 when an adequate amount of pulling force is applied to cam activation shaft 422 by double fold leverage arm 412.

Cam activation shaft 422 has compression springs 420-1, 420-2, 420-3, 420-4 disposed thereon. Compression springs 420-1, 420-2, 420-3, 420-4 are arranged on cam activation shaft 422 such that a compression spring 420-1, 420-2, 420-3, 420-4 resides between each of the cams 410-1, 410-2, 410-3, 410-4. Compression springs 420-1, 420-2, 420-3, 420-4 can be selected to include a spring having a proper spring constant to provide a force acting on a caming surface 908-1, 908-2, 908-3, 908-4 (described below in relation to FIG. 9). The diameters and lengths of compression springs 420-1, 420-2, 420-3, 420-4 can be selected in accordance with the type or size of circuit card clamp 200 desired.

Cam activation shaft 422 is also coupled to tension spring 416. Tension spring 416 is coupled to base member 414 with a spring anchor 426. Tension spring 416 can be selected to include a spring having a great resistance to a pulling force. The diameter and length of tension spring 416 can be selected in accordance with a particular circuit card clamp 200 application. Cam activation shaft 422 will be described in greater detail below (in relation to FIG. 13 through FIG. 15).

A person skilled in the art will appreciate that the back panel 204 architecture is one embodiment of a back panel architecture. The invention is not limited in this regard and any other back panel architecture can be used without limitation.

Figure 7:
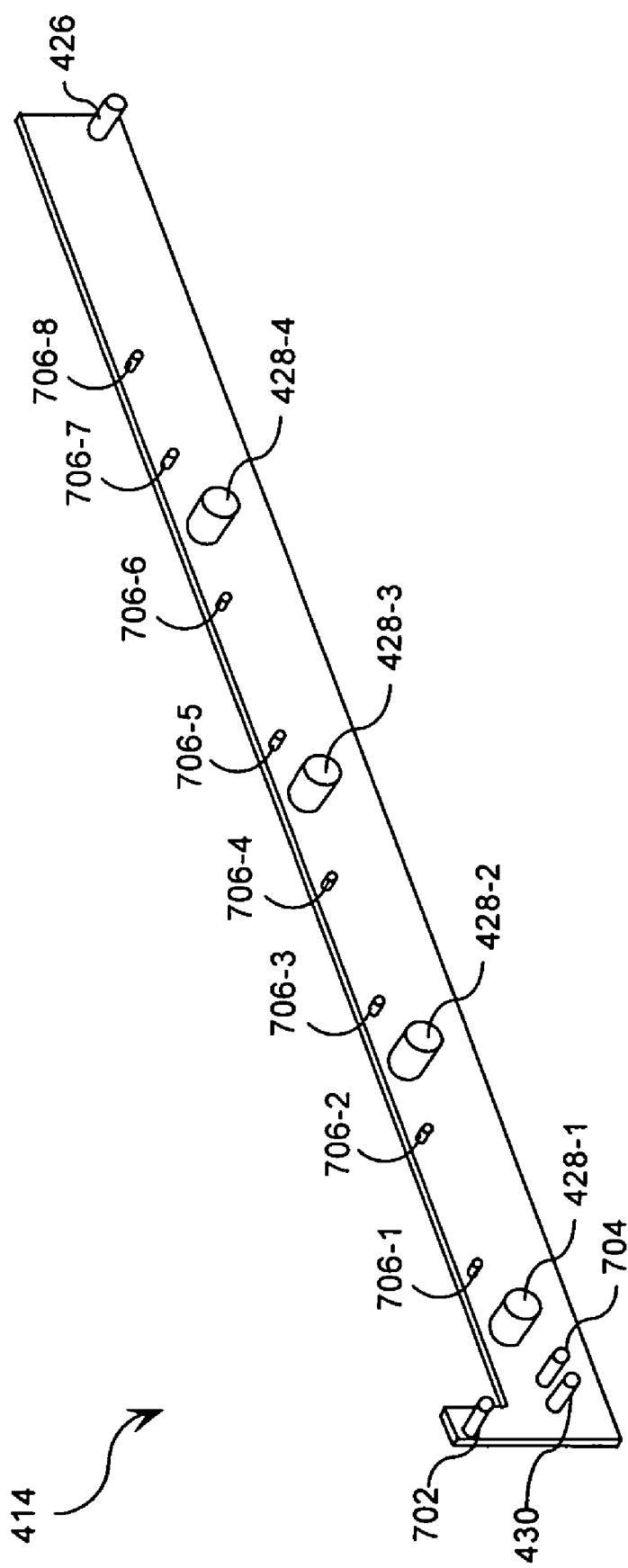
FIG. 7 is a perspective view of a back panel's base member that is useful for understanding the invention.

Referring now to FIG. 7, there is provided a perspective view of base member 414. Base member 414 is comprised of pivot shafts 428-1, 428-2, 428-3, 428-4, spring anchor 426, mechanical connector 430, hook anchor 702, wedge posts 706-1, 706-2, 706-3, 706-4, 706-5, 706-6, 706-7, 706-8, and leverage arm stopper 704. Pivot shafts 428-1, 428-2, 428-3, 428-4 can be designed in accordance with a particular cam 410-1, 410-2, 410-3, 410-4 application. For example, the pivot shaft's 428-1, 428-2, 428-3, 428-4 diameters and heights can be selected for insertion into a bore of a cam 410-1, 410-2, 410-3, 410-4 such that the cam can pivot freely about the shaft. Wedge posts 706-1, 706-2, 706-3, 706-4, 706-5, 706-6, 706-7, 706-8 are provided for ensuring that wedge members 418-1, 418-2, 418-3, 418-4 can be adequately secured between front panel 202 and back panel 204 such that they will not be dislodged from circuit card clamp 200. Each listed component of base member 414 can be comprised of any material commonly used in the art, such as a metal, a metal alloy, a composite material, or a rigid polymer. Each listed component can also be coupled to base member 414 by any attachment means commonly used in the art, such as a rivet or an adhesive. Alternatively, base member 414 can be machined to include one or more of the listed components.

A person skilled in the art will appreciate that each listed component of base member 414 can be sized in accordance with a particular base member application. A person skilled in the art will further appreciate that the base member 414 architecture is one embodiment of a base member architecture. The invention is not limited in this regard and any other base member architecture can be used without limitation.

Figure 8:
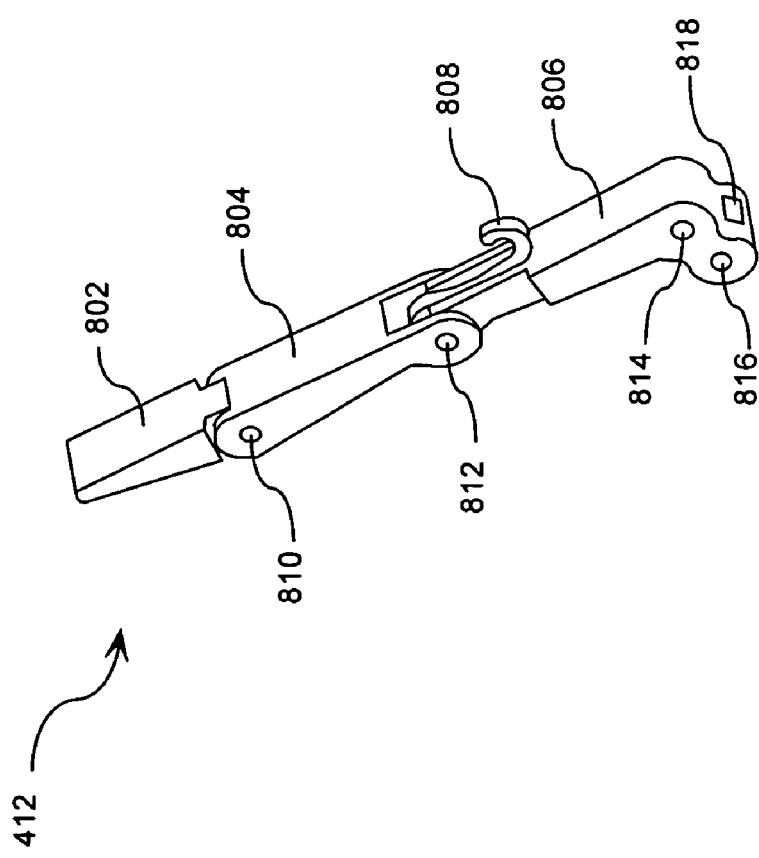
FIG. 8 is a perspective view of a double fold leverage arm that is useful for understanding the invention.

Referring now to FIG. 8, there is provided a perspective view of double fold leverage arm 412. Double fold leverage arm 412 is comprised of first stage leverage arm 802, a second stage leverage arm 804, a third stage leverage arm 806, and a hook 808. First stage leverage arm 802 includes a bore for receipt of a mechanical connector 810. For example, a rivet can be used for this purpose. Similarly, second stage leverage arm 804 includes a bore for receipt of mechanical connector 810. First stage leverage arm 802 is coupled to second stage leverage arm 804 with mechanical connector 810 in manner that allows first stage leverage arm 802 the ability to pivot about mechanical connector 810.

Second stage leverage arm 804 includes a bore for receipt of a mechanical connector 812 (such as a rivet). Similarly, hook 808 and third stage leverage arm 806 include bores for receipt of mechanical connector 812. Second stage leverage arm 804 is coupled to hook 808 with mechanical connector 812 in a manner that allows both components the ability to pivot about mechanical connector 812. Second stage leverage arm 804 and hook 808 are also coupled to third stage leverage arm 806 with mechanical connector 812.

Third stage leverage arm 806 includes a bore for receipt of mechanical connector 430 (such as a rivet). Third stage leverage arm 806 can pivot about connector 430. Third stage leverage arm 806 also includes a slot 818 for receipt of cam activation shaft 422. Third stage leverage arm 806 also includes a bore for receipt of mechanical connector 432 (for example, a rivet) in a manner for attaching cam activation shaft 422 to double fold leverage arm 412.

A person skilled in the art will appreciate that each listed component of double fold leverage arm 412 can be sized in accordance with a particular leverage arm application. For example, the amount of desired leverage required to engage the cam activation shaft 422 can dictate the length of the first stage leverage arm 802, second stage leverage arm 804, and third stage leverage arm 806. A person skilled in the art will also appreciate that the double fold leverage arm 412 can be designed to provide an optimized leverage.

A person skilled in the art will further appreciate that the double fold leverage arm 412 architecture is one embodiment of a leverage arm architecture. The invention is not limited in this regard and any other leverage arm architecture can be used without limitation provided that it provides a sufficient leverage for engaging a cam activation shaft.

Figure 9:
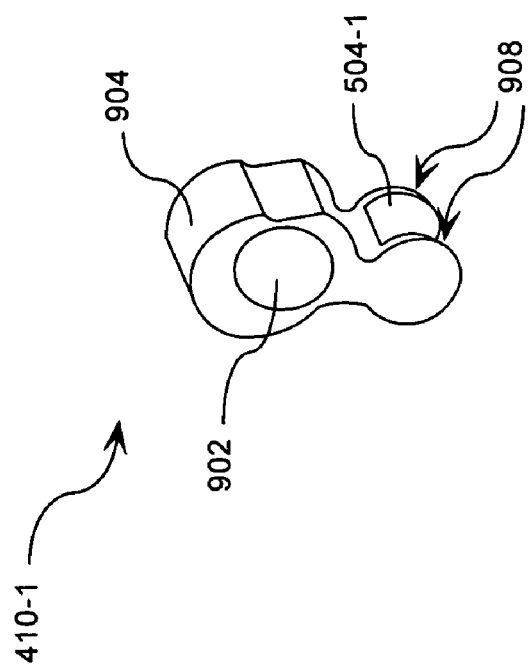
FIG. 9 is a perspective view of a cam that is useful for understanding the invention.

Referring now to FIG. 9, there is provided a perspective view of a cam 410-1. Cam 410-1 has a dog bone shape with a camming surface 904. Camming surface 904 interacts with an adjacent wedge member 418-1 when an adequate amount of pushing force is applied to the cam 410-1 such that it rotates clockwise. Cam 410-1 includes a bore 902 for receipt of a pivot shaft 428-1. Cam 410-1, 410-2, 410-3, 410-4 also includes a passageway 504-1 for receipt of cam activation shaft 422. Passageway 504-1 includes one or more camming surfaces 908 configured for interacting with cam activation shaft 422 when a sufficient amount of force is applied to cam activation shaft 422.

A person skilled in the art will appreciate that bore 902 and passageway 504-1 can be sized in accordance with a particular cam 410-1 application. For example, the specifications of the pivot shaft 428-1 can dictate the sizing of bore 902. Similarly, the specifications of cam activation shaft 422 can dictate the sizing of passageway 504-1.

A person skilled in the art will further appreciate that the cam 410-1 architecture is one embodiment of a cam architecture. The invention is not limited in this regard and any other cam architecture can be used without limitation. Also, it should be appreciated that cams 410-2, 410-3, 410-4 (described above in relation to FIG. 4 through FIG. 6) are of the same design as cam 410-1.

FIG. 10 is a perspective view of a wedge member 418-1 that is useful for understanding the invention. Wedge member 418-1 is provided with opposing ends having inclined surfaces 426-1, 426-2. Inclined surface 426-2 can be designed for abutting an adjacent ramp member 312-1 such that inclined surface 426-2 can easily slide against a ramp member 312-1 when compressed together with a sufficient amount of force. Wedge member 418-1 is also comprised of a flat, elongated clamping surface 402-1 which can engage a surface 112 of circuit card 104 for exerting a clamping force against circuit card 104. Clamping surface 402-1 provides a thermal interface between circuit card 104 and chassis edge 110. Wedge member 418-1 is further comprised of a surface 426-1 for interacting with an adjacent cam 410-1 when an adequate amount of force is applied to the cam 410-1 such that it rotates clockwise about pivot shaft 428-1.

Referring now to FIG. 11 and FIG. 12, each wedge member 418-1 is comprised of a slot 1102 adapted for receiving wedge posts 706-1, 706-2 (shown in FIG. 7). Slot 1102 has a height 1106, a width 1202, and a length 1108 sized in accordance with a particular circuit card clamp 200 application. Slot 1102 in conjunction with the wedge posts 706-1, 706-2 provide a system for adequately securing the wedge member 418-1 between front panel 202 and back panel 204 such that they will not be dislodged from circuit card clamp 200.

A person skilled in the art will appreciate that the wedge member architecture shown in FIG. 10, FIG. 11, and FIG. 12 is one embodiment of a wedge member architecture. The invention is not limited in this regard and any other wedge member architecture can be used without limitation. Also, it should be appreciated that wedge members 418-2, 418-3, 418-4 (described above in relation to FIG. 4 and FIG. 6) are of the same design as wedge member 418-1.

FIG. 13 is a top view of an elongated cam activation shaft 422 shown in FIG. 4 and FIG. 5. Cam activation shaft 422 is comprised of a primary shaft member 1302 and secondary shaft members 1304-1, 1304-2, 1304-3. As shown in FIG. 13, cam activation shaft 422 is comprised of three (3) secondary shaft members 1304-1, 1304-2, 1304-3. Still, a person skilled in the art will appreciate that the invention is not limited in this regard. The number of shaft members and length of each shaft member may be varied in accordance with the type or size of circuit card clamp 200 desired.

A more detailed description of the primary shaft member 1302 and the secondary shaft members 1304-1, 1304-2, 1304-3 will now follow. Referring to FIG. 14, there is provided a perspective view of the primary shaft member 1302 that is useful for understanding the invention. Primary shaft member 1302 is comprised of a first body member 1402, a second body member 1406, and a third body member 1408. First body member 1402 is comprised of a bore 1410 for receiving mechanical connector 432 (for example, a rivet).

Second body member 1406 has a diameter selected for receiving a compression spring 420-1. Second body member 1406 is sized in accordance with passageway 504-1 described above (in relation to FIG. 5 and FIG. 9). In this regard, second body member 1406 provides a surface 1404 for engaging a cam when a sufficient amount of force is applied to cam activation shaft 422.

Third body member 1408 has a diameter selected in accordance with a particular cam activation shaft 422 application. For example, the diameter can be selected for interacting with a compression spring 420-1 when cam activation shaft 422 is actuated. Third body member 1408 also has a threaded bore 1412 for receiving a threaded end of a secondary shaft member 1304-1, 1304-2, 1304-3, described below (in relation to FIG. 15).

Referring to FIG. 15, there is provided a perspective view of a secondary shaft member 1304-1 that is useful for understanding the invention. Secondary shaft member 1304-1 is comprised of a first body member 1502, a second body member 1506, and a third body member 1508. First body member 1502 is comprised of threaded post having a diameter selected for insertion into threaded bore 1412 of primary shaft member 1302 or for insertion into threaded bore of another secondary shaft member 1304-2, 1304-3.

Second body member 1506 has a diameter selected for receiving a compression spring 420-2. Second body member 1506 is sized in accordance with passageway 504-2 described above (in relation to FIG. 5). In this regard, second body member 1506 provides a surface 1504 for engaging an adjacent cam 410-2 when a sufficient amount of force is applied to cam activation shaft 422.

Third body member 1508 has a diameter selected in accordance with a particular cam activation shaft 422 application. For example, the diameter can be selected for interacting with a compression spring 420-2 when cam activation shaft 422 is actuated. Third body member 1508 has a threaded bore 1510 for receiving a threaded post of a first body member of another secondary shaft member 1304-2, 1304-3.

A person skilled in the art will appreciate that the secondary shaft member 1304-1 architecture is one embodiment of a secondary shaft member architecture. The invention is not limited in this regard and any other secondary shaft member architecture can be used without limitation. Also, it should be appreciated that secondary shaft members 1304-2, 1304-2 are of the same design as secondary shaft member 1304-1.

A person skilled in the art will further appreciate that the cam activation shaft 422 architecture of FIG. 13, FIG. 14, and FIG. 15 is one embodiment of a cam activation shaft architecture. The invention is not limited in this regard and any other cam activation shaft architecture can be used without limitation.

Figure 16A:
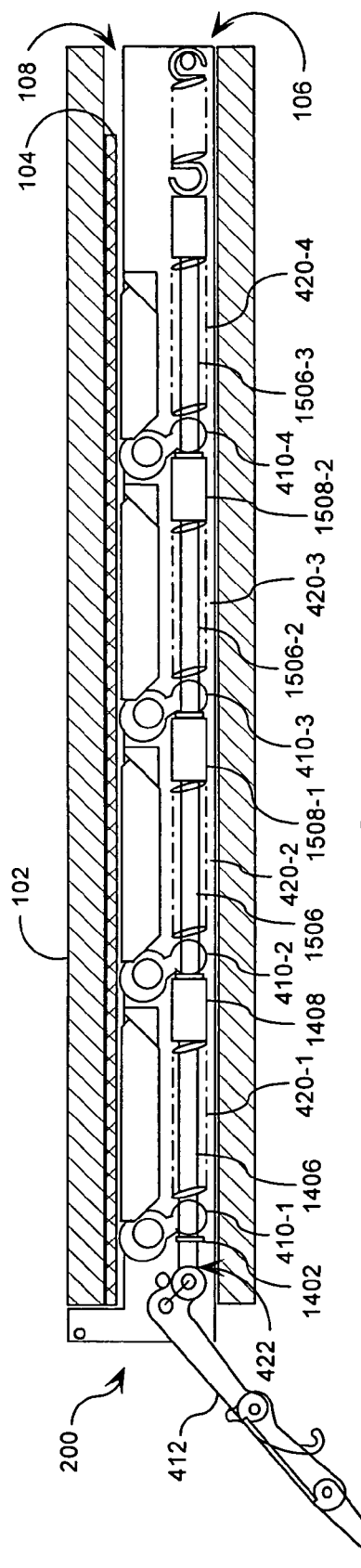

Referring now to FIG. 16A through FIG. 16H, there is provided an illustration of a circuit card clamp 200 engagement that is useful for understanding the invention. As shown in FIG. 16A, circuit card clamp 200 is in its relaxed state. In this state, double fold leverage arm 412 is in a first position where the distance between wedge members 418-1, 418-2, 418-3, 418-4 front surfaces 402-1, 402-2, 402-3, 402-4 and chassis's 102 surface 110 is maximized. In such a situation, a circuit card 104 can be freely passed into insert space 108.

According to an embodiment of the invention, the distance between wedge member's 418-1, 418-2, 418-3, 418-4 front surfaces 402-1, 402-2, 402-3, 402-4 and circuit card's 104 surface 114 equals 0.025 inches when circuit card clamp 200 is in its relaxed position. Still a person skilled in the art will appreciate that the invention is not limited in this regard. The dimensions of circuit card clamp 200 can be designed in accordance with a circuit card clamp application (i.e., designed such that the distance between wedge members 418-1, 418-2, 418-3, 418-4 and circuit card 104 equals a predetermined value when circuit card clamp 200 is in its relaxed state).

Also in this relaxed state, cam 410-1 is in contact with first body member 1402 and second body member 1406 of cam activation shaft 422. Cams 410-2, 410-3, 410-4 are in contact with the respective second body members 1506-1, 1506-2, 1506-3 of cam activation shaft 422. Cam 410-2 is also in contact with third body member 1408 of cam activation shaft 422. Cam 410-3 is also in contact with third body member 1508-1 of cam activation shaft 422. Cam 410-4 is also in contact with third body member 1508-2 of cam activation shaft 422. Compression springs 420-1, 420-2, 420-3, 420-4 are in their rest positions (i.e., pre-load positions). Tension spring 416 is also in its rest position (i.e., pre-load position).

Figure 16B:
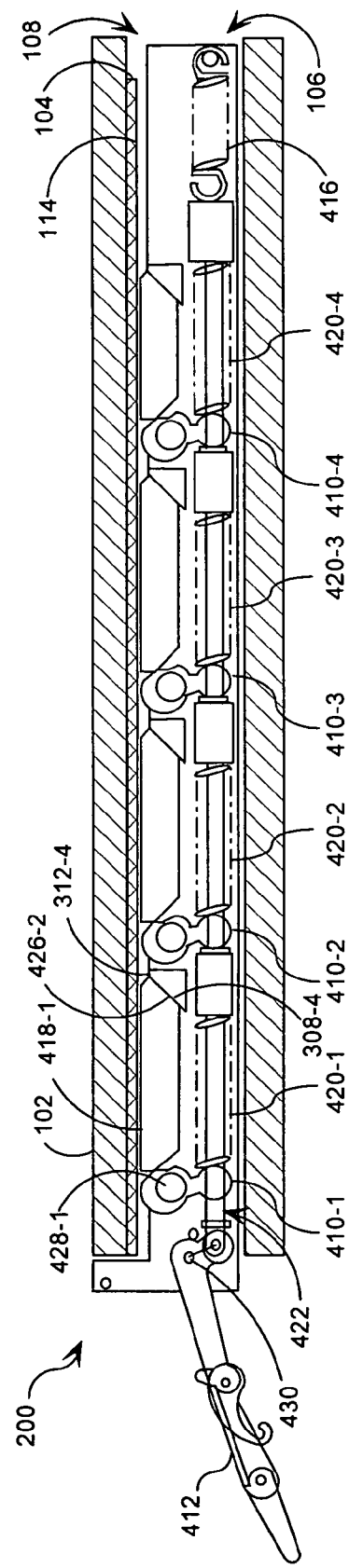

Referring now to FIG. 16B, circuit card clamp 200 is in a partially relaxed state. Double fold leverage arm 412 is pivoted about pivot pin 430 until it reaches a second position. As a result, cam activation shaft 422 is pulled into a second position causing an interaction between cam activation shaft 422, compression springs 420-1, 420-2, 420-3, 420-4, and cams 410-1, 410-2, 410-3, 410-4. For example, cam activation shaft 422 is pulled to the second position such that it applies a pushing force against compression spring 420-1. In turn, compression spring 420-1 applies a pushing force against cam 410-1 causing cam 410-1 to pivot clockwise about pivot shaft 428-1. Cam 410-1 applies a pushing force against wedge member 418-1. By applying this pushing force, wedge member 418-1 is compressed against ramp member 312-4. Ramp member 312-4 deflects wedge member 418-1 such that wedge member's 418-1 inclined surface 426-2 slides against inclined surface 308-4 of ramp member 312-4. As a result, circuit card clamp's 200 width is increased. According to an embodiment of the invention, the distance between wedge member's 418-1 front surfaces 402-1 and circuit card's 104 surface 114 is decreased from 0.025 inches to 0.010 inches.

A pulling force is also applied to tension spring 416. Compression springs 420-1, 420-2, 420-3, 420-4 are still in their rest positions. However, each compression spring's 420-1, 420-2, 420-3, 420-4 position has been shifted by the cam activation shaft 422 such that each abuts a respective cam 410-1, 410-2, 410-3, 410-4.

Figure 16C:
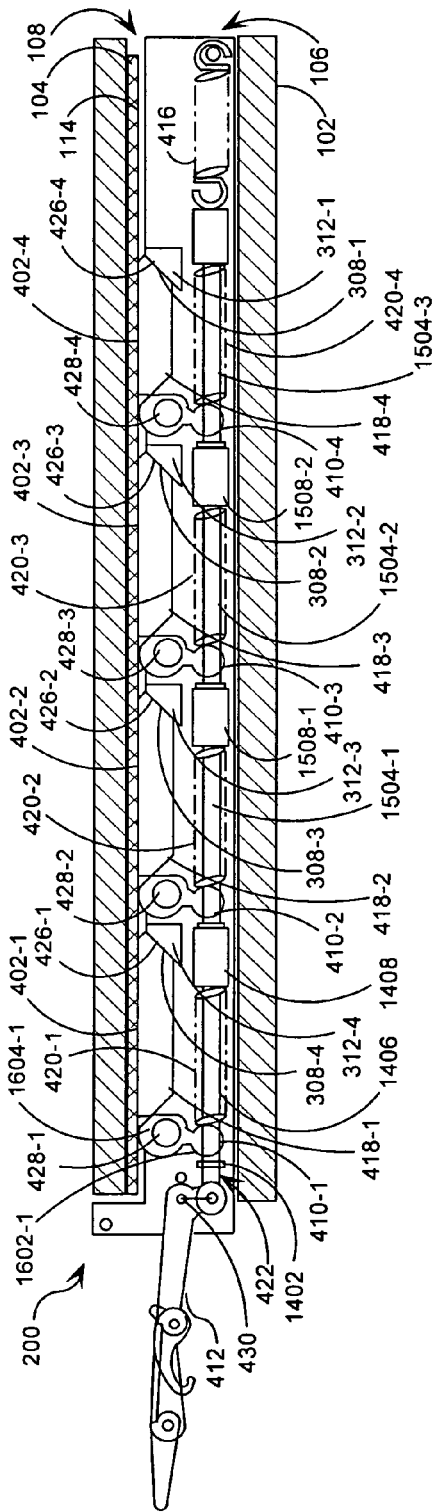

Referring now to FIG. 16C, double fold leverage arm 412 is further pivoted about pivot pin 430 to its third position. As a result, cams 410-1, 410-2, 410-3, 410-4 are pivoted clockwise about the respective pivot shafts 428-1, 428-2, 428-3, 428-4. Wedge member's 418-1, 418-2, 418-3, 418-4 are compressed against ramp members 312-1, 312-2, 312-3, 312-4 such that inclined surfaces 426-1, 426-2, 426-3, 426-4 continue to slide against inclined surfaces 308-1, 308-3, 308-4 of the respective ramp members 312-1, 312-2, 312-3, 312-4. This process causes the distance between wedge member's 418-1, 418-2, 418-3, 418-4 front surfaces 402-1, 402-2, 402-3, 402-4 and circuit card's 104 surface 114 to be further decreased. According to an embodiment of the invention, the distance is decreased from 0.010 inches to 0.000 inches.

Cam 410-1 and first body member 1402 of cam activation shaft 422 are separated. Cam member 410-1 applies a pushing force against compression spring 420-1 (i.e., compression springs 420-1 is in its first load position). It should be appreciated that when the cam 410-1 and the first body member 1402 separate, the cam activation shaft 422 can continue to move in its current direction of travel causing the compression spring 420-1 to act on the lower section 1602-1 of the cam 410-1. Consequently, the top section 1604-1 of the cam 410-1 will further compress the wedge member 418-1 against the ramp member 312-4. As a result, an increased clamping force will be applied on the circuit card 104.

Similarly, cams 410-2, 410-3, 410-4 are separated from the respective third body members 1408, 1508-1, 1508-2. Cams 410-2, 410-3, 410-4 apply a pushing force against the respective compression springs 420-2, 420-3, 420-4 (i.e., compression springs 420-2, 420-3, 420-4 are in their first load positions). Each Cam 410-2, 410-3, 410-4 can further compress the wedge members 418-2, 418-3, 418-4 against the ramp members 312-3, 312-2, 312-1, respectively. As a result, an increased clamping force will be applied on the circuit card 104. Also, the pulling force applied to tension spring 416 is increased.

Figure 16D:
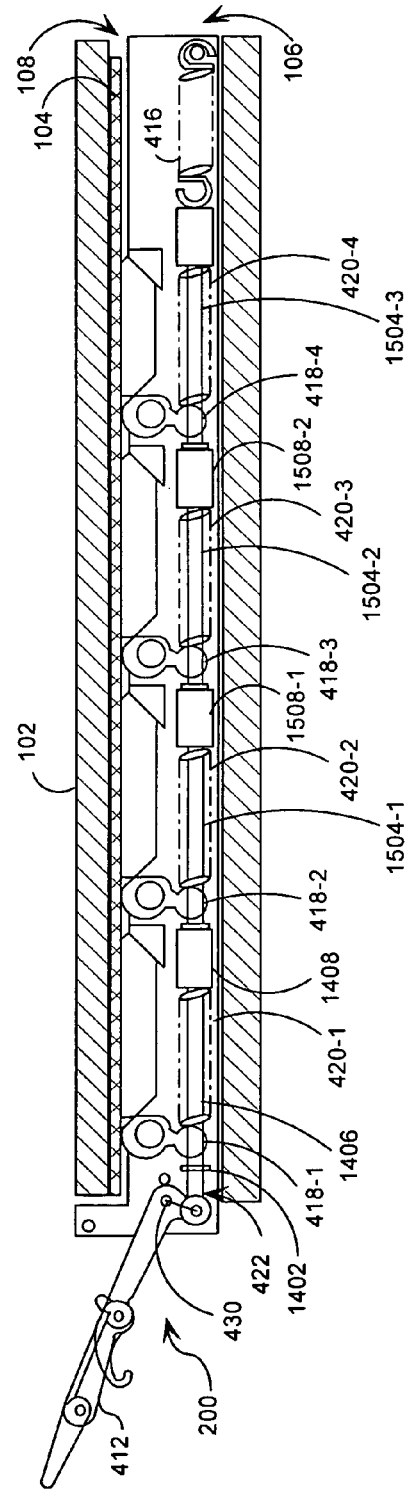

Referring now to FIG. 16D, leverage arm 412 is pivoted about pivot pin 430 until it reaches a fourth position. Cam 410-1 and first body member 1402 of cam activation shaft 422 are further separated. Cam 410-1 applies an increased pushing force against compression spring 420-1 (i.e., the compression load is increased). Similarly, cams 410-2, 410-3, 410-4 are further separated from the respective third body members 1408, 1508-1, 1508-2. Cams 410-2, 410-3, 410-4 apply an increased pushing force against the respective compression springs 420-2, 420-3, 420-4. Also, the pulling force applied to tension spring 416 is further increased.

Referring now to FIG. 16E, double fold leverage arm 412 is pivoted about pivot pin 430 until it reaches a fifth position. In this position, hook 808 is placed in a latching position about anchor 702. Referring to FIG. 16F, hook 808 is latched to anchor 702 for securing double fold leverage arm 412 in its fifth position. When double fold leverage arm 412 is in this position, compression springs 420-1, 420-2, 420-3, 420-4 provide a sufficient amount of force to lock wedge members 418-1, 418-2, 418-3, 418-4 in their final positions for applying a sufficient clamping force against circuit card 104 in accordance with a circuit card clamp 200 application. Referring to FIG. 16G, first stage leverage arm 802 is folded. Referring to FIG. 16H, second stage leverage arm 804 is folded.

A person skilled in the art will appreciate that tension spring 416 provides a system for resiliently biases the elongated cam activation shaft 422. In this regard, tension spring 416 provides a system for returning circuit card clamp 200 to its relaxed position. For example, circuit card clamp 200 is released from its fifth position when hook 808 is unlatched. In effect, tension spring 416 returns to its rest position (i.e., pre-load position) causing the cam activation shaft 422 to retract, cams 410-1, 410-2, 410-3, 410-4 to pivot counter-clockwise about the respective pivot shafts 428-1, 428-2, 428-3, 428-4, and wedge members 418-1, 418-2, 418-3, 418-4 to be released from their locked positions.

Notably, the overall width of circuit card clamp 200 can be increased or decreased by adjusting the position of double fold leverage arm 412.

A person skilled in the art will also appreciate that the double fold leverage arm 412 is one mechanism to move the cam activation shaft 422. It should be understood that the invention is not limited in this regard and any suitable mechanism for moving the cam activation shaft 422 can be used without limitation. For example, a button can be provided to push the cam activation shaft 422 in a direction to cause the overall width of the circuit card clamp 200 to be increased. In such a scenario, a compression spring can be provided to return the circuit card clamp 200 to its relaxed position.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. A method for applying a clamping force to a circuit card, comprising:
   rotatably mounting at least one cam to a base member, said at least one cam configured for converting a linear motion of a shaft actuated by a lever into a circular motion;
   rotating a first end of said at least one cam about a pivot point by applying a force, aligned with a first direction, to a second end of said at least one cam opposed from said first end; and
   moving a wedge member in a second direction transverse to said first direction by sliding a camming surface formed on said first end of said at least one cam along a first side of said wedge member to clamp the circuit card.

2. The method according to claim 1, further comprising guiding a second side of said wedge member opposed from said first side along a ramp member defining an inclined surface.

3. The method according to claim 1, further comprising:
   rotatably mounting a plurality of said cams linearly spaced apart along said base member in a direction parallel to said first direction;
   concurrently rotating each of the said cams about a respective pivot point by applying said force to a second end of each said cam opposed from each said first end; and
   moving a plurality of said wedge members in a second direction transverse to said first direction by sliding said camming surface formed on said first end of each said cam along said first side of each said wedge member.

4. The method according to claim 1, further comprising positioning said base member so that a clamping surface of said wedge member is opposed from a rigid clamping face extending in a direction transverse to said second direction to define an insert space sized for receiving said circuit card.

5. The method according to claim 1, further comprising applying said force to said second end of said cam using an elongated cam activation shaft having at least one compression spring disposed thereon.

6. The method according to claim 5, further comprising resiliently biasing said cam activation shaft in a second direction opposed to said first direction.

7. The method according to claim 6, further comprising applying said force to said cam activation shaft using a leverage arm pivotally coupled to said base member.

8. The method according to claim 7, further comprising coupling said force from said leverage arm to said cam activation shaft at a rotatable pivot coupling formed on a first end of said cam activation shaft.

9. A method for applying a clamping force to a circuit card, comprising:
- rotatably mounting at least one cam to a base member;
- rotating a first end of said at least one cam about a pivot point by applying a force, aligned with a first direction, to a second end of said at least one cam opposed from said first end;
- moving a wedge member in a second direction transverse to said first direction by sliding a camming surface formed on said first end of said at least one cam along a first side of said wedge member;
- applying said force to said second end of said at least one cam using an elongated cam activation shaft having at least one compression spring disposed thereon;
- resiliently biasing said elongated cam activation shaft in a second direction opposed to said first direction; and
- wherein said resiliently biasing step further comprises attaching a tension spring between a portion of said elongated cam activation shaft and said base member.

10. A circuit card clamp, comprising:
- a base member,
- at least one cam rotatably mounted to said base member, said at least one cam having a first camming surface;
- a cam activating device coupled to said base member and configured to produce a rotational motion of said at least one cam by pushing said at least one cam when a non-rotational pulling force is applied to said cam activating device; and
- a wedge member having at least one side positioned for engaging said first camming surface, said wedge member movable from a first position to a second position in response to a rotational motion of said at least one cam to clamp a circuit card.

11. The circuit card clamp according to claim 10, wherein said cam activating device is comprised of an elongated shaft aligned transverse to a direction of travel of said wedge member as defined by a movement of said wedge member from said first position to said second position.

12. The circuit card clamp according to claim 10, wherein said first camming surface is disposed on a first end of said at least one cam, and said cam activating device is coupled to a second end of said at least one cam.

13. The circuit card claim according to claim 12, wherein said first and second ends of said at least one cam are spaced apart by a body portion disposed between said first and second ends.

14. The circuit card clamp according to claim 12, wherein said second end of said at least one cam is radially spaced apart from said first end, whereby a motion of said second end defines a curved path about said shaft when said at least one cam is rotated.

15. The circuit card clamp according to claim 14, wherein said cam activating device is comprised of an elongated shaft.

16. The circuit card clamp according to claim 15, wherein at least one cam engagement face is provided along a length of said elongated shaft, said cam engagement face configured for engaging a second camming surface formed on said second end of said cam.

17. A circuit card clamp, comprising:
- a base member;
- at least one cam rotatably mounted to said base member, said at least one cam having a first camming surface disposed on a first end of said at least one cam;
- a cam activating device comprised of an elongated shaft, coupled to a second end of said at least one cam and configured to produce a rotational motion of said at least one cam, said second end of said at least one cam is radially spaced apart from said first end, whereby a motion of said second end defines a curved path about said elongated shaft when said at least one cam is rotated;
- a wedge member having at least one side positioned for engaging said first camming surface, said wedge member movable from a first position to a second position in response to a rotational motion of said at least one cam;
- at least one cam engagement face is provided along a length of said elongated shaft, said cam engagement face configured for engaging a second camming surface formed on said second end of said at least one cam; and
- wherein said elongated shaft is slidably mounted to said base member for linear movement aligned with a tangent to a portion of said curved path.

18. The circuit card clamp according to claim 17, further comprising a leverage arm said leverage arm rotatably coupled to a first end of the elongated shaft and pivotally coupled to said base member, whereby varying a position of said leverage arm produces said linear movement.

19. The circuit card clamp according to claim 18, further comprising a tension spring resiliently biasing said elongated shaft.

20. A circuit card clamp, comprising:
- a base member;
- at least one cam rotatable mounted to said base member, said at least one cam having a first camming surface;
- a cam activating device coupled to said at least one cam and configured to produce a rotational motion of said at least one cam;
- a wedge member having at least one side positioned for engaging said first camming surface, said wedge member movable from a first position to a second position in response to a rotational motion of said at least one cam;
- a ramp mounted in a fixed position relative to said base member; and
- a ramp engagement surface defined on a second side of said wedge member opposed from said first side, said ramp engagement surface positioned adjacent to an inclined surface defined by said ramp member, wherein said ramp engagement surface slides along said inclined surface to move said wedge member from said first position to said second position in response to said rotational motion of said at least one cam.

21. A circuit card clamp, comprising:
- a base member;
- at least one cam rotatably mounted to said base member, said at least one cam having a first camming surface;

a cam activating device coupled to said at least one cam and configured to produce a rotational motion of said at least one cam;

a wedge member having at least one side positioned for engaging said first camming surface, said wedge member movable from a first position to a second position in response to a rotational motion of said at least one cam;

a plurality of cams rotatably mounted to a plurality of shafts linearly spaced apart along a length of said base member;

said cam activating device coupled to each cam of said plurality of cams and configured to produce a rotational motion of each said cam of said plurality of cams; and a plurality of wedge members having at least one side positioned for engaging said first camming surface of each said cam of said plurality of cams, and movable from a first position to a second position in response to said rotational motion of said plurality of cams.

22. The circuit card clamp 21, wherein said circuit card clamp is positioned within a slot of a chassis so that a clamping surface of each said wedge member of said plurality of wedge members is opposed from a rigid clamping face, said clamping surface of each said wedge member spaced apart from said clamping face to define an insert space sized for receiving said circuit card.

23. A circuit card clamp, comprising:
a base member having at least one shaft mounted thereto;
at least one cam rotatably mounted to said shaft, said cam having a first camming surface disposed on a first end of said at least one cam;
a second end of said at least one cam radially spaced apart from said first end;
a cam activating device coupled to said cam and configured to produce a rotational motion of said cam about said shaft, said cam activating device comprised of an elongated shaft having at least one cam engagement face operatively coupled to a second camming face formed on said second end of said at least one cam, said elongated shaft slidably mounted to said base member for linear movement;

a wedge member having at least one side positioned for engaging said first camming surface, said wedge member movable from a first position to a second position in response to a rotational motion of said cam; and a leverage arm rotatably coupled to a first end of the elongated shaft and pivotally coupled to said base member, whereby varying a position of said leverage arm produces said linear movement.

24. The circuit card clamp according to claim 23, further comprising a ramp member mounted in a fixed position relative to said base member, and a ramp engagement surface defined on a second side of said wedge member opposed from said first side, said ramp engagement surface positioned adjacent to an inclined surface defined by said ramp member, wherein said ramp engagement surface slides along said inclined surface to move said wedge member from said first position to said second position in response to said rotational motion of said cam.

25. The circuit card clamp according to claim 23, further comprising:
a plurality of said cams rotatably mounted to a plurality of said shafts linearly spaced apart along a length of said base member;
wherein said cam activating device is coupled to said second end of each said cam and configured to produce a rotational motion of each said cam; and
a plurality of wedge members, each having at least one side positioned for engaging said first camming surface of each said cam, and movable from said first position to said second position in response to said rotational motion of each said cam.

* * * * *